(12) United States Patent
Mori et al.

(10) Patent No.: US 11,043,614 B2
(45) Date of Patent: Jun. 22, 2021

(54) LIGHT-EMITTING DEVICE

(71) Applicant: NICHIA CORPORATION, Anan (JP)

(72) Inventors: Yuta Mori, Anan (JP); Yusaku Funakura, Tokushima (JP)

(73) Assignee: NICHIA CORPORATION, Anan (JP)

(*) Notice: Subject to any disclaimer, the term of this patent is extended or adjusted under 35 U.S.C. 154(b) by 95 days.

(21) Appl. No.: 16/395,135

(22) Filed: Apr. 25, 2019

(65) Prior Publication Data

US 2019/0334062 A1 Oct. 31, 2019

(30) Foreign Application Priority Data

Apr. 26, 2018 (JP) .............................. JP2018-085386
Mar. 28, 2019 (JP) .............................. JP2019-062394

(51) Int. Cl.
*H01L 33/46* (2010.01)
*H01L 33/38* (2010.01)
*H01L 33/40* (2010.01)

(52) U.S. Cl.
CPC .............. *H01L 33/46* (2013.01); *H01L 33/38* (2013.01); *H01L 33/405* (2013.01)

(58) Field of Classification Search
CPC ....... H01L 33/38; H01L 33/40; H01L 33/405; H01L 33/46
USPC ...................................................... 257/98
See application file for complete search history.

(56) References Cited

U.S. PATENT DOCUMENTS

| | | |
|---|---|---|
| 2008/0185606 A1 | 8/2008 | Sano et al. |
| 2012/0223357 A1 | 9/2012 | Jeon |
| 2015/0263236 A1 | 9/2015 | Suzuki |
| 2015/0325751 A1* | 11/2015 | Sano ............... H01L 33/405 257/98 |
| 2016/0315225 A1 | 10/2016 | Kageyama |
| 2017/0141260 A1 | 5/2017 | Chen et al. |
| 2017/0263816 A1 | 9/2017 | Yang et al. |
| 2018/0040788 A1 | 2/2018 | Jeon et al. |

FOREIGN PATENT DOCUMENTS

| | | |
|---|---|---|
| JP | 2008-192710 A | 8/2008 |
| JP | 2008-210903 A | 9/2008 |
| JP | 2009-164423 A | 7/2009 |
| JP | 2012-099700 A | 5/2012 |
| JP | 2015-173177 A | 10/2015 |
| JP | 2016-208012 A | 12/2016 |

* cited by examiner

*Primary Examiner* — Monica D Harrison
(74) *Attorney, Agent, or Firm* — Foley & Lardner LLP

(57) ABSTRACT

A light-emitting device includes: a semiconductor stacked body including: an n-type semiconductor layer having a light extraction surface and an n-side contact surface, the n-side contact surface being located on a side opposite the light extraction surface, a light-emitting layer located at a region of the n-type semiconductor layer other than the n-side contact surface, and a p-type semiconductor layer located on the light-emitting layer, wherein the p-type semiconductor layer surrounds the n-side contact surface in a top view; a first insulating film located at a region including a central portion of the n-side contact surface; an n-side electrode including an n-contact portion located at the n-side contact surface at a periphery of the first insulating film, the n-contact portion contacting the n-side contact surface; and a p-side electrode located on the p-type semiconductor layer and contacting the p-type semiconductor layer.

12 Claims, 8 Drawing Sheets

LIGHT-EMITTING DEVICE

CROSS-REFERENCE TO RELATED APPLICATION

This application is based upon and claims priority to Japanese Patent Application No. 2018-085386, filed on Apr. 26, 2018, and Japanese Patent Application No. 2019-062394, filed on Mar. 28, 2019; the entire contents of which are incorporated herein by reference.

FIELD

The present disclosure relates to a light emitting device.

BACKGROUND

It is desirable to increase the light reflection efficiency at an n-side contact surface contacting an electrode in a light-emitting device having a structure in which the light is extracted from a surface of the n-type semiconductor layer on the side opposite to the n-side contact surface.

SUMMARY

According to an embodiment of the invention, a light-emitting device includes a semiconductor stacked body. The semiconductor stacked body includes an n-type semiconductor layer, a light-emitting layer, and a p-type semiconductor layer. The n-type semiconductor layer has a light extraction surface and an n-side contact surface. The n-side contact surface is provided on a side opposite to the light extraction surface. The light-emitting layer is provided at a region of the n-type semiconductor layer other than the n-side contact surface. The p-type semiconductor layer is provided on the light-emitting layer. The p-type semiconductor layer is provided to surround the n-side contact surface when viewed in top-view. The light-emitting device includes a first insulating film, an n-side electrode, and a p-side electrode. The first insulating film is provided at a region including a central portion of the n-side contact surface. The n-side electrode includes an n-contact portion provided at the n-side contact surface at a periphery of the first insulating film. The n-contact portion contacts the n-side contact surface. The p-side electrode is provided on the p-type semiconductor layer and contacts the p-type semiconductor layer.

DETAILED DESCRIPTION

Figure 1:
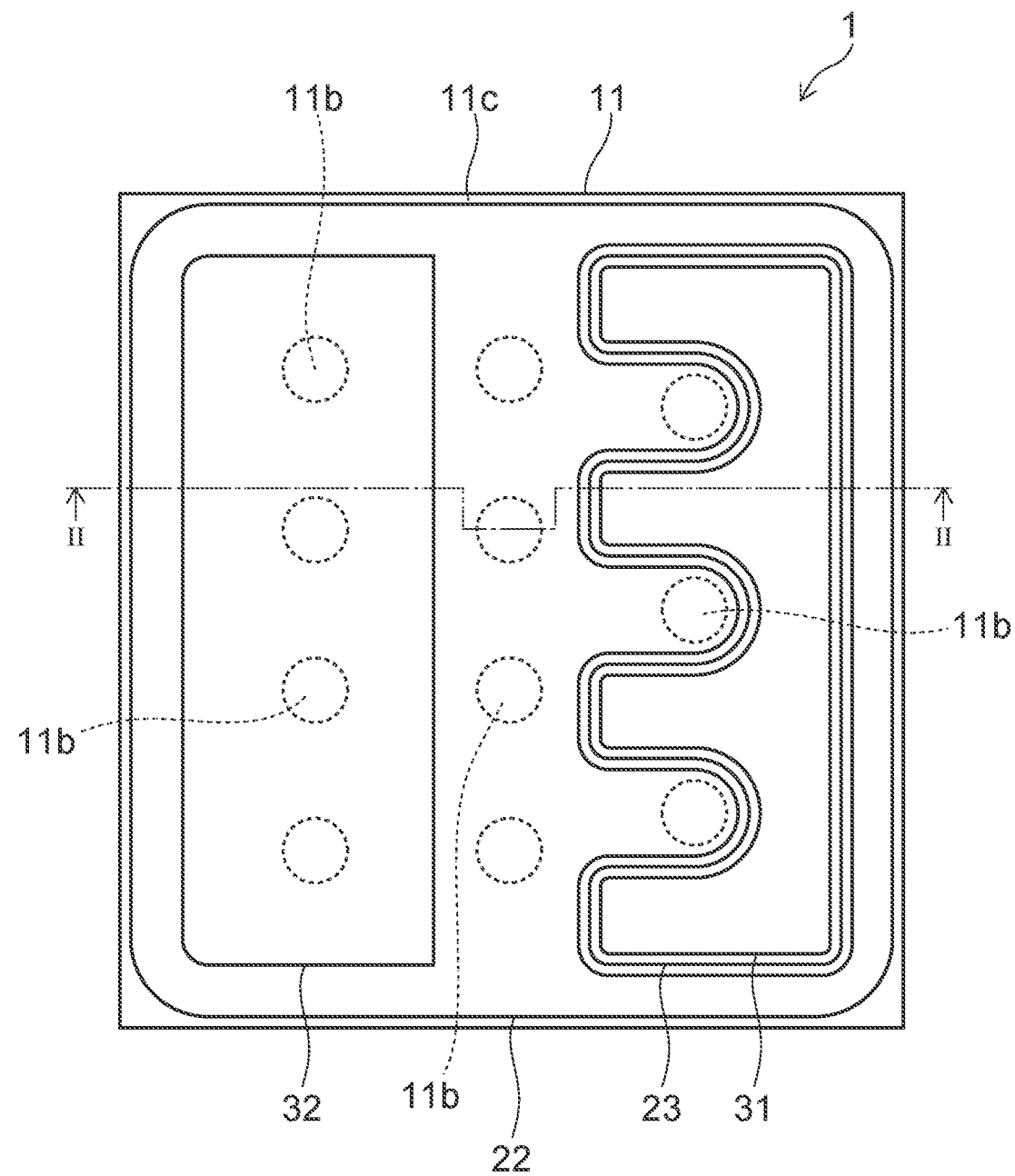
FIG. 1 is a schematic top view of a light-emitting device of a first embodiment of the invention.

Embodiments will now be described with reference to the drawings. The same components in the drawings are marked with the same reference numerals.

FIG. 1 is a schematic top view of a light-emitting device 1 of a first embodiment of the invention.

Figure 2:
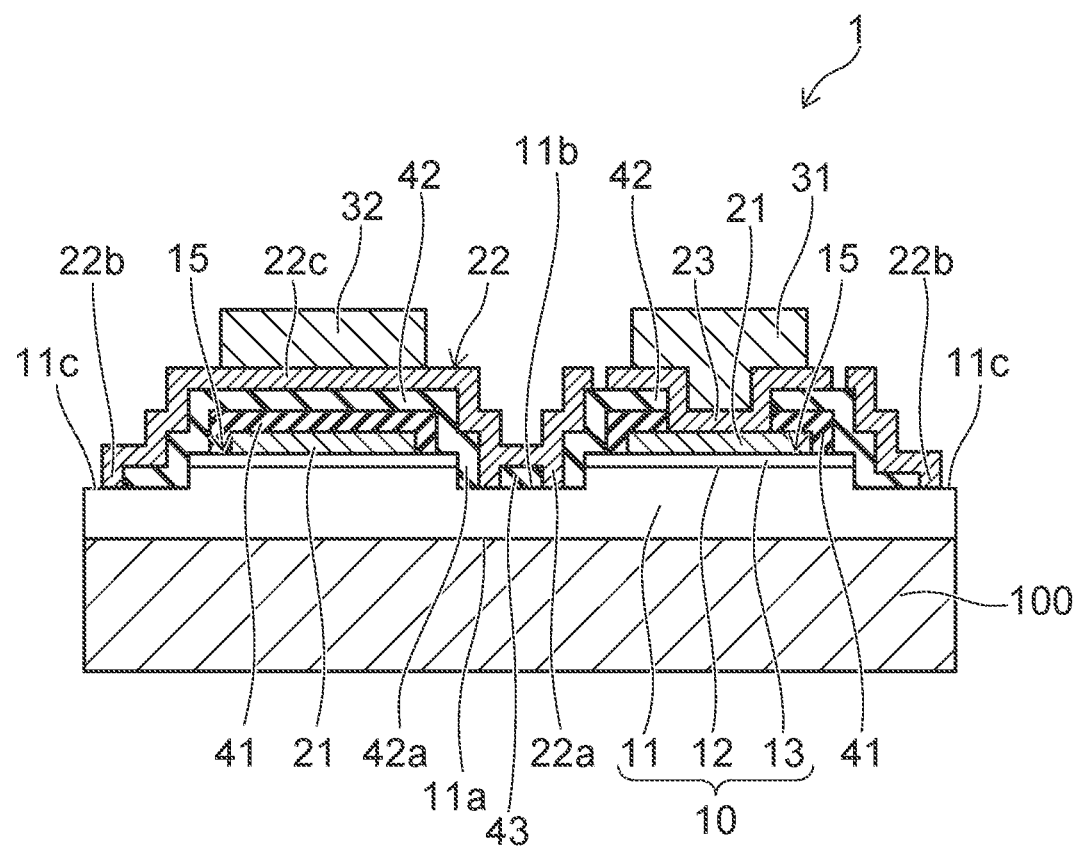
FIG. 2 is a cross-sectional view of the light-emitting device of the first embodiment, taken along the line II-II in FIG. 1.

FIG. 2 is a cross-sectional view of the light-emitting device of the first embodiment, taken along the line II-II in FIG. 1.

The light-emitting device 1 includes a substrate 100, and a semiconductor stacked body 10 provided on the substrate 100. The semiconductor stacked body 10 includes an n-type semiconductor layer 11 provided on the substrate 100, a light-emitting layer 12 provided on the n-type semiconductor layer 11, and a p-type semiconductor layer 13 provided on the light-emitting layer 12.

The substrate 100 is transmissive to the light emitted by the light-emitting layer 12. The semiconductor stacked body 10 can be epitaxially grown on the substrate 100. For example, sapphire, spinel ($MgAl_2O_4$), silicon carbide (SiC), silicon, ZnS, ZnO, GaAs, diamond, lithium niobate, neodymium gallate, etc., are examples of the material of the substrate 100.

It is favorable for the semiconductor stacked body 10 to include, for example, a semiconductor such as $In_XAl_YGa_{1-X-Y}N$ ($0 \leq X$, $0 \leq Y$, and $X+Y<1$), etc.

As shown in FIG. 2, the n-type semiconductor layer 11 has a light extraction surface 11a, and an n-side contact surface 11b provided on the side opposite to the light extraction surface 11a. The light extraction surface 11a is positioned at the interface between the n-type semiconductor layer 11 and the substrate 100. The light from the light extraction surface 11a passes through the substrate 100 and is extracted from mainly the side surface of the substrate 100. In the light-emitting device 1, the light from the light-emitting layer 12 is extracted mainly from the side surface of the substrate 100.

The light-emitting layer 12 and the p-type semiconductor layer 13 are not provided at the n-side contact surface 11b. For example, the n-type semiconductor layer 11, the light-emitting layer 12, and the p-type semiconductor layer 13 are epitaxially grown in order on the substrate 100, and subsequently, the n-side contact surface 11b is formed by performing etching to remove a portion of the stacked portion of the p-type semiconductor layer 13 and the light-emitting layer 12. The portion where the p-type semiconductor layer 13 and the light-emitting layer 12 are stacked remains in a mesa-shaped configuration on the n-type semiconductor layer 11.

Figure 3:
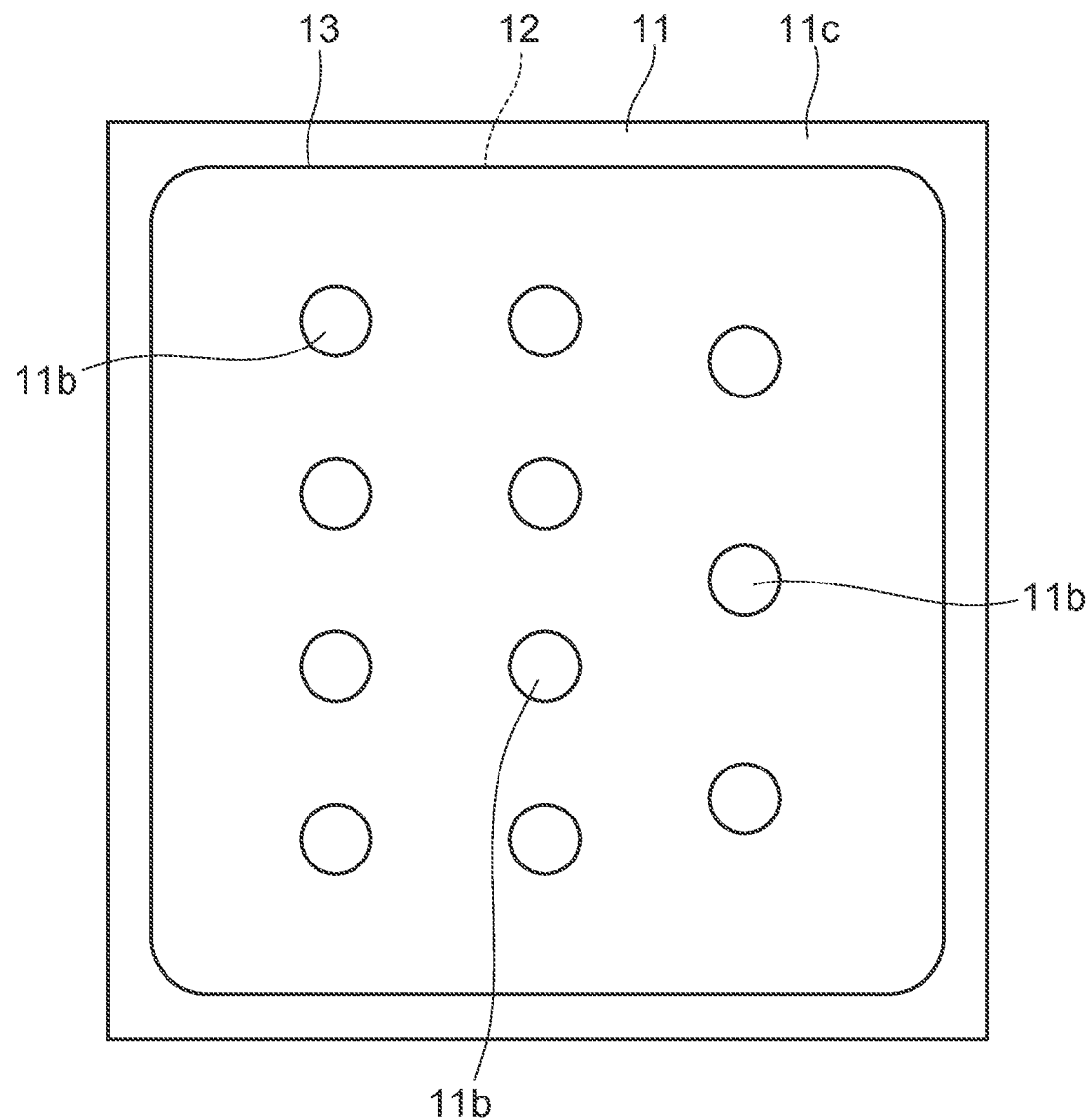
FIG. 3 is a schematic top view of a semiconductor stacked body of the light-emitting device of the first embodiment.

FIG. 3 is a schematic top view of the semiconductor stacked body 10. FIG. 3 is a top view as viewed from the side opposite to the light extraction surface 11a shown in FIG. 2.

For example, multiple n-side contact surfaces 11b that have circular configurations are provided in the surface of the n-type semiconductor layer 11 on the side opposite to the light extraction surface 11a. The light-emitting layer 12 and the p-type semiconductor layer 13 are provided at a region of the surface of the n-type semiconductor layer 11 on the side opposite to the light extraction surface 11a other than the n-side contact surface 11b and an outer perimeter region 11c.

In a top-view as shown in FIG. 3, the light-emitting layer 12 and the p-type semiconductor layer 13 are provided to surround the n-side contact surfaces 11b.

As shown in FIG. 2, a first p-side electrode 21 is provided on the p-type semiconductor layer 13. The first p-side electrode 21 contacts the upper surface of the p-type semiconductor layer 13.

An first insulating film 41 is provided on the p-type semiconductor layer 13 to cover the upper surfaces of the first p-side electrode 21 and the p-type semiconductor layer 13. An second insulating film 42 is provided to cover the first insulating film 41.

The second insulating film 42 covers the side surface of the p-type semiconductor layer 13, the side surface of the light-emitting layer 12, and the side surface of the n-type semiconductor layer 11 continuing from the side surfaces of the p-type semiconductor layer 13 and the light-emitting layer 12. In other words, the second insulating film 42 covers the side surface of a mesa-shaped portion 15, which is the portion where the light-emitting layer 12 and the p-type semiconductor layer 13 are stacked.

An n-side electrode 22 is provided on the second insulating film 42. As recited above, the second insulating film 42 has steps covering the side surfaces of the members, and the n-side electrode 22 is provided along the steps. The n-side electrode 22 includes an n-contact portion 22a contacting the n-side contact surface 11b, an external connection portion 22c provided on the second insulating film 42 on the mesa-shaped portion 15, and an outer perimeter contact portion 22b contacting the outer perimeter region 11c of the n-type semiconductor layer 11. The n-contact portion 22a, the external connection portion 22c, and the outer perimeter contact portion 22b are connected as one body.

An n-side post electrode 32 is provided on the external connection portion 22c. The n-side post electrode 32 is electrically connected to the n-type semiconductor layer 11 via the n-side electrode 22.

An opening is made in a portion of the insulating films 41 and 42 covering the first p-side electrode 21; and a second p-side electrode 23 is provided in the opening. The second p-side electrode 23 contacts the first p-side electrode 21. A portion of the second p-side electrode 23 is provided on the second insulating film 42. A p-side post electrode 31 is provided on the second p-side electrode 23. The p-side post electrode 31 is electrically connected to the p-type semiconductor layer 13 via the second p-side electrode 23 and the first p-side electrode 21.

Figure 4:
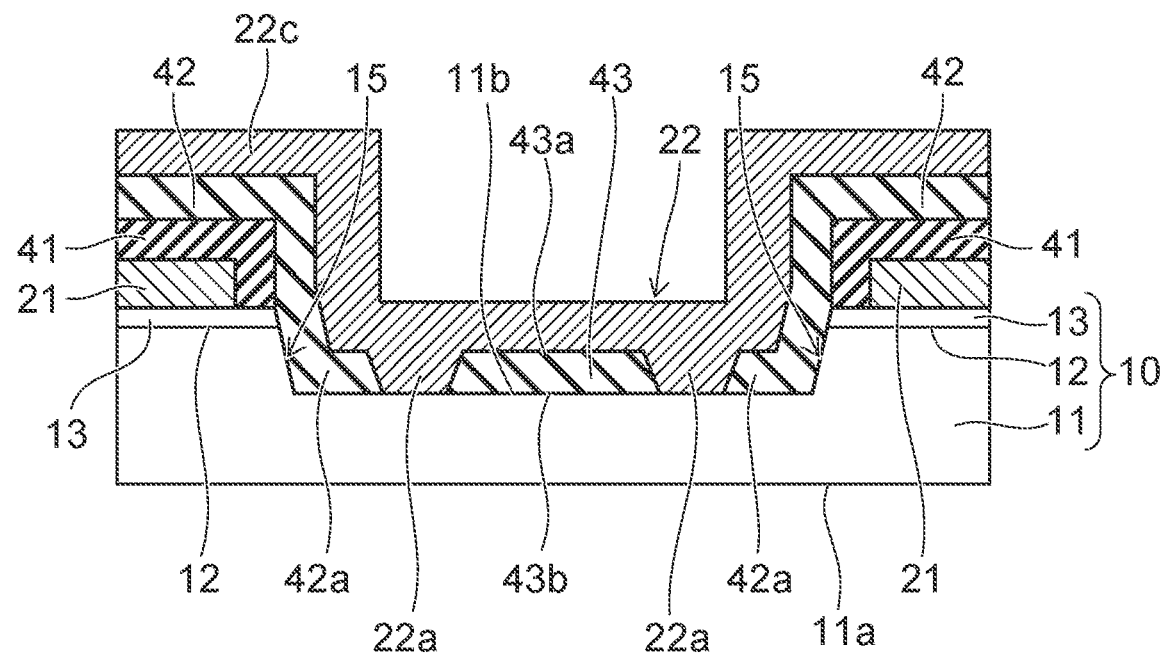
FIG. 4 is a schematic enlarged cross-sectional view of a part of the light-emitting device of the first embodiment.

FIG. 4 is a schematic enlarged cross-sectional view of the region of the light-emitting device 1 where the n-side contact surface 11b is provided.

For example, an third insulating film is provided in a region of the circular n-side contact surface 11b including the central portion. The n-side contact surface 11b includes the region including the central portion, and a region surrounding the periphery of the region including the central portion. In the case in which the n-side contact surface 11b has a circular configuration, the "region including the central portion" is a region including the center of the circle. In the case in which the n-side contact surface 11b has a polygonal configuration, the "region including the central portion" is a region including the center of the inscribed circle of the polygon. In the case in which the n-side contact surface 11b has a circular ring configuration, the "region including the central portion" is a region including the center of the circle formed by the inner or outer perimeter of the circular ring.

Figure 5:
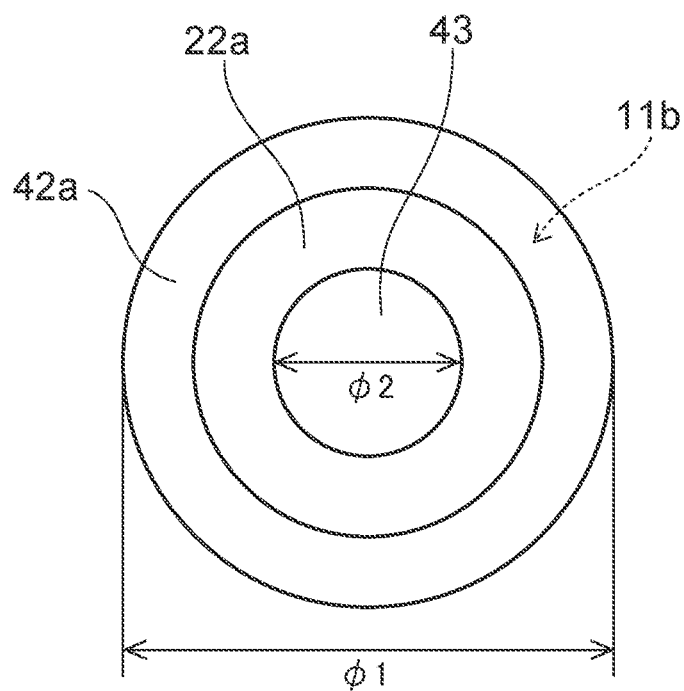
FIG. 5 is a schematic plan view of a part of the light-emitting device of the first embodiment.

FIG. 5 is a schematic plan view showing the arrangement, in a plan view, of the n-side contact surface 11b, the third insulating film, and the n-contact portion 22a of the n-side electrode 22.

The second insulating film 42 is formed to cover the entire semiconductor stacked body 10. The second insulating film 42 is patterned so that the third insulating film remains in, for example, a circular configuration at the n-side contact surface 11b. Accordingly, the second insulating film 42 and the third insulating film are films of the same type of material. The film thickness of the second insulating film 42 and the film thickness of the third insulating film are substantially the same.

Due to the process used when patterning the second insulating film 42, a portion 42a of the second insulating film 42 remains in, for example, a circular ring configuration at the outer perimeter region of the n-side contact surface 11b.

The n-contact portion 22a of the n-side electrode 22 is provided at the periphery of the third insulating film and is provided in, for example, a circular ring configuration surrounding the circular third insulating film.

Due to the etching process used when patterning the third insulating film, the cross-sectional configuration of the third insulating film becomes a trapezoid as shown in FIG. 4. The trapezoid includes an upper base 43a, and a lower base 43b that is longer than the upper base 43a. The lower base 43b is positioned at the interface with the n-side contact surface 11b.

It is favorable for the first p-side electrode 21 to include, for example, Ag, Al, Ni, Ti, or Pt, or an alloy including these metals as major components. The first p-side electrode 21 may be a single layer or a stack of these metal materials.

For example, the n-side electrode 22 and the second p-side electrode 23 are obtained by patterning a film of the same metal material. It is favorable for the n-side electrode 22 and the second p-side electrode 23 to include, for example, Ag, Al, Ni, Rh, Au, Cu, Ti, Pt, Pd, Mo, Cr, or W, or an alloy including these metals as major components. The n-side electrode 22 and the second p-side electrode 23 may be single layers or stacks of these metal materials.

The n-side electrode 22 and the second p-side electrode 23 each include, for example, an Al film, a Ti film, a Pt film, and a Au film formed in order from the foundation interface side.

It is favorable for the n-side post electrode 32 and the p-side post electrode 31 to include, for example, a metal such as Cu, Au, Ni, etc. For example, the n-side post electrode 32 and the p-side post electrode 31 can be formed by electroplating.

The first insulating film 41 is, for example, a silicon nitride film. The first insulating film 41 prevents, for example, the migration of Ag included in the first p-side electrode 21. The second insulating film 42 and the third insulating film are, for example, silicon oxide films.

The n-side post electrode 32 and the p-side post electrode 31 are bonded via a conductive material such as, for example, solder, etc., to pads formed on a wiring substrate where the light-emitting device 1 is mounted. In other words, for the light-emitting device 1, the substrate 100 and the light extraction surface 11a of the n-type semiconductor layer 11 face upward from the wiring substrate in a state in which the n-side post electrode 32 and the p-side post electrode 31 face the wiring substrate. The substrate 100 may not be provided.

The light that is emitted from the light-emitting layer 12 is extracted to the outside via the light extraction surface 11a. The greater part of the region on the side opposite to the light extraction surface 11a is covered with the metal films of the p-side electrodes 21 and 23 and the n-side electrode 22 (including, for example, Ag and Al which have good light reflectivity). Therefore, the light that is not oriented directly toward the light extraction surface 11a from the light-emitting layer 12 and the light that is reflected at the interface between the n-type semiconductor layer 11 and the substrate 100 can be oriented toward the light extraction surface 11a by being reflected by the metal films.

In the region including the central portion of the n-side contact surface 11b, the n-side electrode 22 is not provided; and the third insulating film is provided. Therefore, at the region including the central portion of the n-side contact surface 11b, the light absorption by the metal included in the n-side electrode 22 can be reduced; and the total internal reflection component at the interface between the third insulating film and the n-type semiconductor layer 11 can be increased. This increases the reflectance at the n-side contact surface 11b of the light propagating through the n-type semiconductor layer 11 toward the n-side contact surface 11b and increases the light extraction efficiency from the light extraction surface 11a side.

Figure 6:
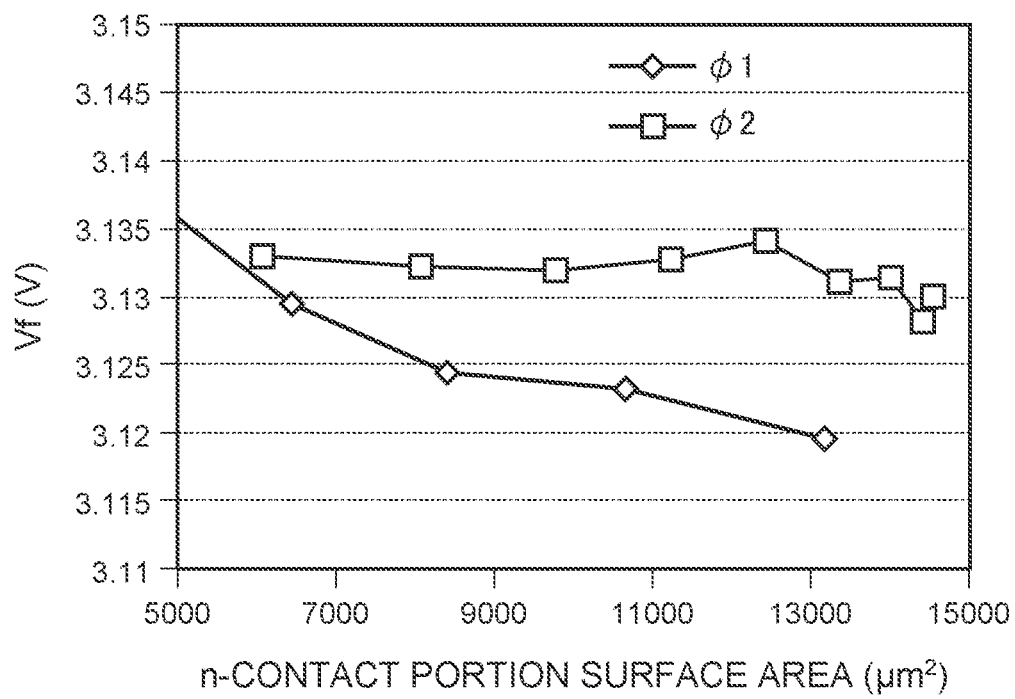
FIG. 6 is a graph of a simulation of a relationship between a forward voltage Vf, and a surface area of an n-contact portion of an n-side electrode contacting an n-side contact surface.

FIG. 6 is a graph of a simulation of the relationship between a forward voltage Vf at 1000 mA and the surface area of the n-contact portion 22a of the n-side electrode 22 contacting the n-side contact surface 11b.

$\phi1$ illustrates the change of Vf with respect to the decrease of the surface area of the n-contact portion 22a accompanying a decrease of the diameter $\phi1$ of the n-side contact surface 11b shown in FIG. 5.

$\phi2$ illustrates the change of Vf with respect to the decrease of the surface area of the n-contact portion 22a accompanying an increase of the diameter $\phi2$ of the third insulating film shown in FIG. 5.

The portion 42a of the second insulating film 42 shown in FIG. 4 is not provided at the outer perimeter region of the n-side contact surface 11b. Accordingly, the surface area of the n-contact portion 22a is the surface area of the third insulating film subtracted from the surface area of the n-side contact surface 11b.

As the diameter $\phi1$ of the n-side contact surface 11b decreases, the surface area of the n-contact portion 22a decreases, and the forward voltage Vf increases. Conversely, when the surface area of the n-contact portion 22a decreases due to the increase of the diameter of the third insulating film, a drastic increase of the forward voltage Vf is not seen.

From such results of FIG. 6, it is considered that the current concentrates at the outer perimeter portion of the n-side contact surface 11b proximal to the external connection portion 22c of the n-side electrode 22, the current substantially does not flow at the central portion, and the current concentrates at the outer perimeter vicinity of the n-side contact surface 11b. Therefore, it can be said that even when the third insulating film is provided at the central portion of the n-side contact surface 11b and the central portion is nonconducting, the current supply toward the light-emitting layer 12 is not impeded, and the forward voltage does not increase easily.

Figure 7:
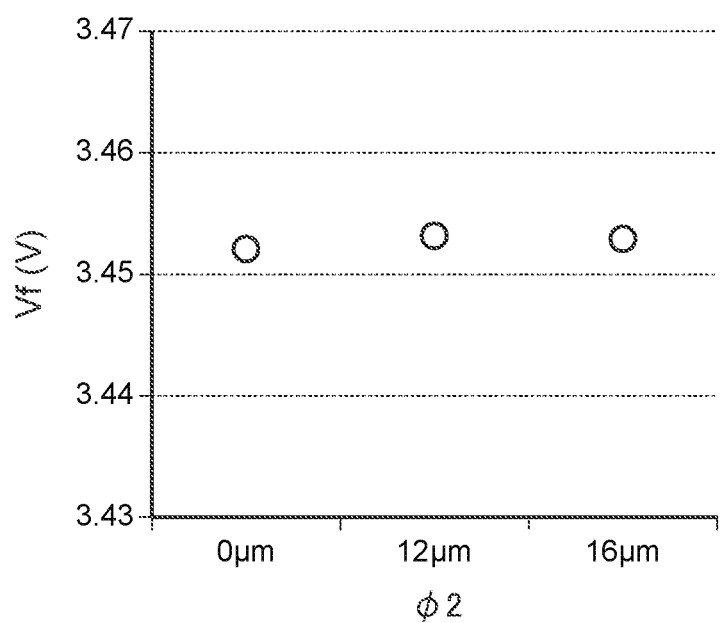
FIG. 7 is a graph of a simulation of a relationship between a diameter φ2 of an insulating film provided at a region including a central portion of an n-side contact surface, and a forward voltage Vf.

FIG. 7 is a graph of a simulation of the relationship between the diameter $\phi2$ of the third insulating film and the forward voltage Vf at 1000 mA. FIG. 7 illustrates the average value of the forward voltage Vf.

Figure 8:
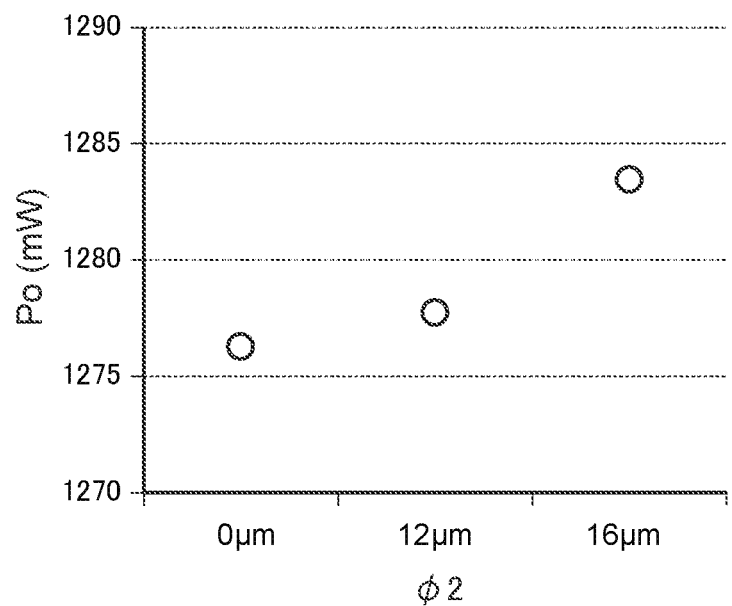
FIG. 8 is a graph of a simulation of a relationship between a diameter φ2 of an insulating film provided at a region including a central portion of an n-side contact surface, and a light intensity Po.

FIG. 8 is a graph of a simulation of the relationship between the diameter $\phi2$ of the third insulating film and a light intensity Po at 1000 mA. FIG. 8 illustrates the average value of the light intensity Po.

In the simulations of FIG. 7 and FIG. 8, the diameter $\phi1$ of the n-side contact surface 11b is fixed at 21 µm. Similarly to the simulation of FIG. 6, the portion 42a of the second insulating film 42 shown in FIG. 4 is not provided at the outer perimeter region of the n-side contact surface 11b.

From the results of FIG. 7 and FIG. 8, when $\phi2$ is 12 µm and when $\phi2$ is 16 µm, the light intensity Po can be increased due to the increase of the total internal reflection region of the third insulating film while maintaining a forward voltage Vf equivalent to when $\phi2$ is 0 µm (when the third insulating film is not provided at the n-side contact surface 11b). In other words, in the light-emitting device 1 in which the third insulating film is provided, the light extraction efficiency can be increased while suppressing the increase of the forward voltage Vf.

From the results of FIG. 7 and FIG. 8, it can be said that it is favorable for the surface area of the n-contact portion 22a to be not less than 40% and not more than 70% of the surface area of the n-side contact surface 11b.

The configurations of the n-side contact surface 11b and the third insulating film are not limited to circular configurations, and may be polygonal configurations.

As shown in FIG. 5, in the case in which the circular third insulating film is provided at the circular n-side contact surface 11b, the configuration of the n-contact portion 22a provided at the periphery of the third insulating film can be a circular ring without corners. The current density distribution can be easily made uniform using the n-contact portion 22a having such a configuration.

Because the cross-sectional configuration of the third insulating film is a trapezoid as shown in FIG. 4, a large interface region between the lower surface (the lower base of the trapezoid) 43b of the third insulating film and the n-type semiconductor layer 11 can be ensured. Thereby, the coverage of the n-side electrode 22 for the third insulating film can be better than that in the case in which the cross-sectional configuration of the third insulating film is, for example, a rectangle.

Figure 9:
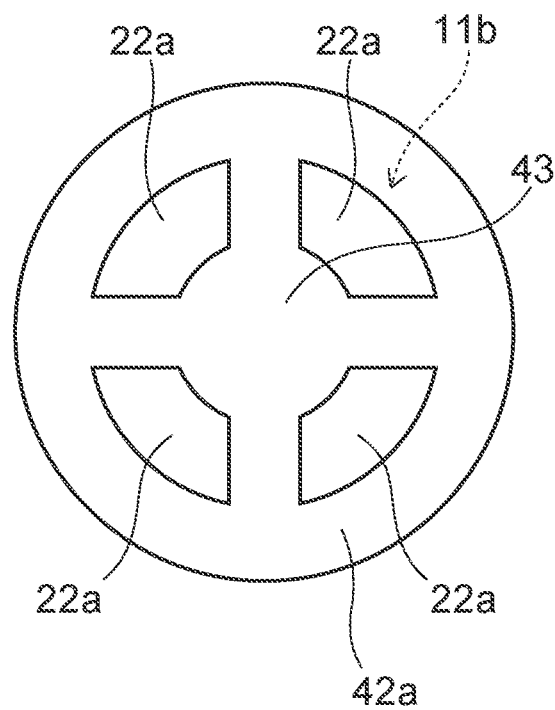
FIG. 9 is a schematic plan view showing another arrangement pattern of components shown in FIG. 5.

FIG. 9 is a schematic plan view showing another arrangement pattern of the components shown in FIG. 5.

The n-contact portion 22a is not limited to being continuous along the direction surrounding the periphery of the third insulating film, and may have a broken line configuration. In such a case, the third insulating film that remains in an island configuration at the central portion of the n-side contact surface 11b can be connected to the portion 42a of the second insulating film 42 which is provided in a wide region to cover the mesa-shaped portion 15, and peeling of the third insulating film can be suppressed.

Figure 10:
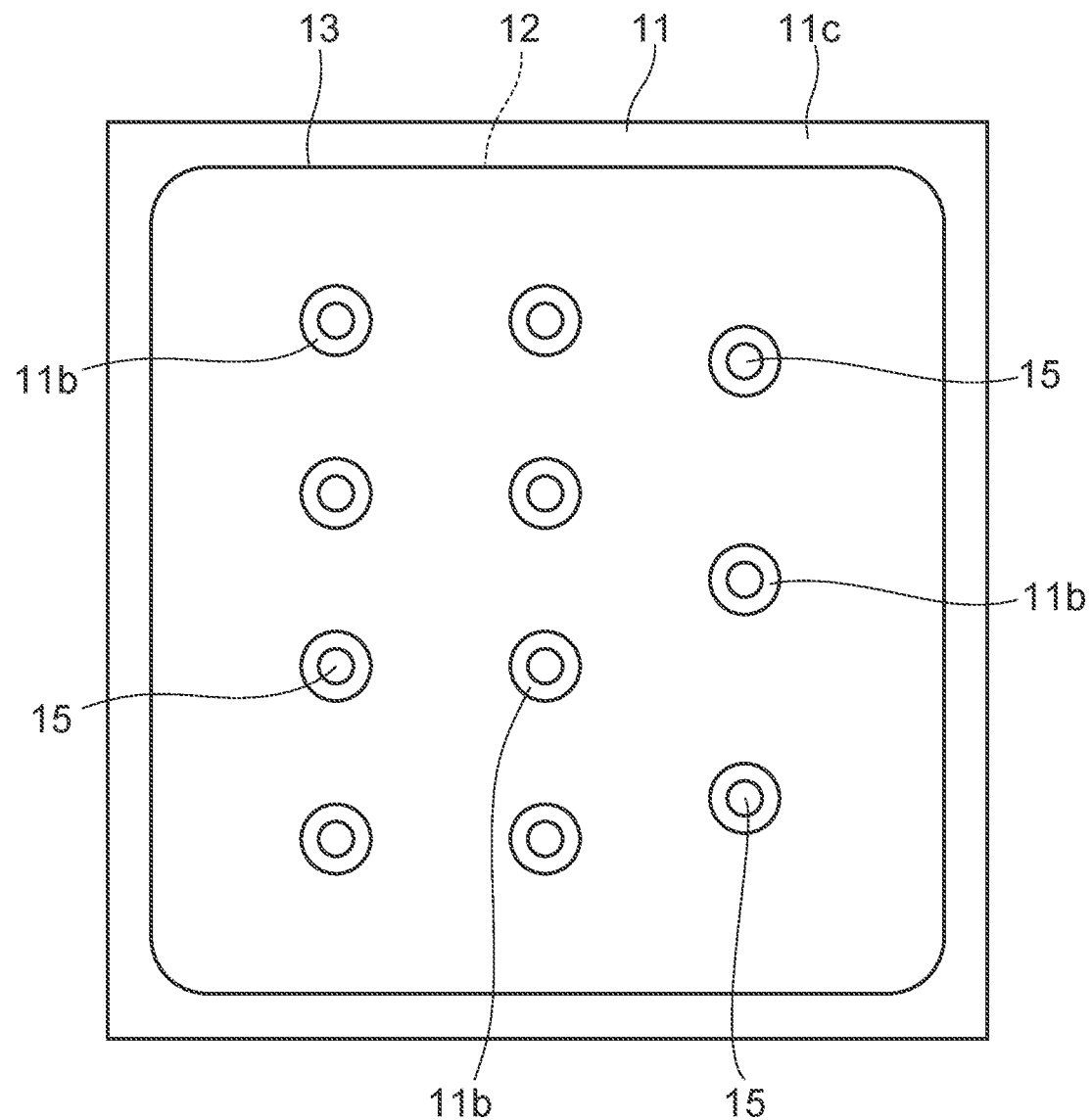
FIG. 10 is a schematic top view of a semiconductor stacked body of a light-emitting device of a second embodiment of the invention.

FIG. 10 is a schematic top view of the semiconductor stacked body 10 of the light-emitting device of a second embodiment of the invention.

Figure 11:
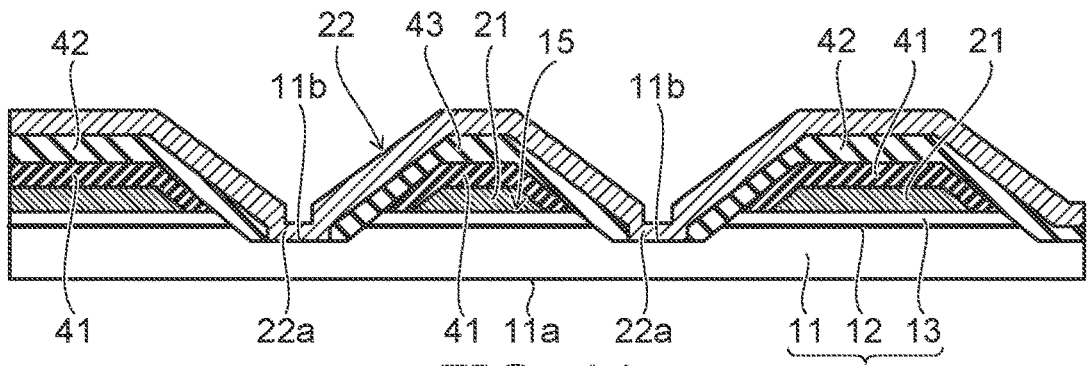
FIGS. 11 to 14 are schematic enlarged cross-sectional views of a part of the light-emitting device of the second embodiment.

FIG. 11 is a schematic enlarged cross-sectional view of the region of the second light-emitting device where the n-side contact surface 11b is provided.

As shown in FIG. 10, the n-side contact surface 11b is formed in a circular ring configuration. A part of the semiconductor stacked body 10 is provided on a region surrounded by the n-side contact surface 11b. For example, the part of the semiconductor stacked body 10 is a mesa-shaped portion 15 where the light-emitting layer 12 and the p-type semiconductor layer 13 are stacked.

As shown in FIG. 11, the mesa-shaped portion 15 protrudes from the n-side contact surface 11b. The third insulating film covers a top surface and a side surface of the mesa-shaped portion 15. The third insulating film is provided directly on the side surface of the mesa-shaped portion 15. The first insulating film 41 and the first p-side electrode 21 are provided between the third insulating film and the top surface of the mesa-shaped portion 15. The third insulating film may be provided directly on the top surface of the mesa-shaped portion 15 without the first insulating film 41 and the first p-side electrode 21 between the third insulating film and the top surface of the mesa-shaped portion 15.

Figure 12:
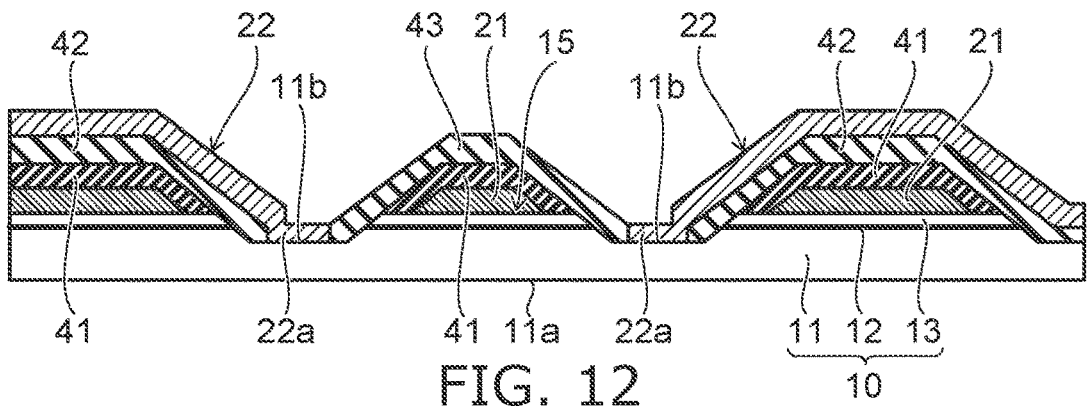

The n-side electrode 22 is provided on the third insulating film. The n-contact portion 22a of the n-side electrode 22 contacts the circular ring shaped n-side contact surface 11b surrounding the mesa-shaped portion 15. Or, as shown in FIG. 12, the n-side electrode 22 may not be provided on the third insulating film surrounded by the n-side contact surface 11b.

The three-dimensional third insulating film covering the top surface and the side surface of the mesa-shaped portion 15 increases an area of the third insulating film in a region including the central portion of the n-side contact surface 11b compared to the planar third insulating film shown in FIG. 4. This increases a total reflection light by the third insulating film of the emitted light of the light-emitting layer 12 in a region including the central portion of the n-side contact surface 11b.

Figure 13:
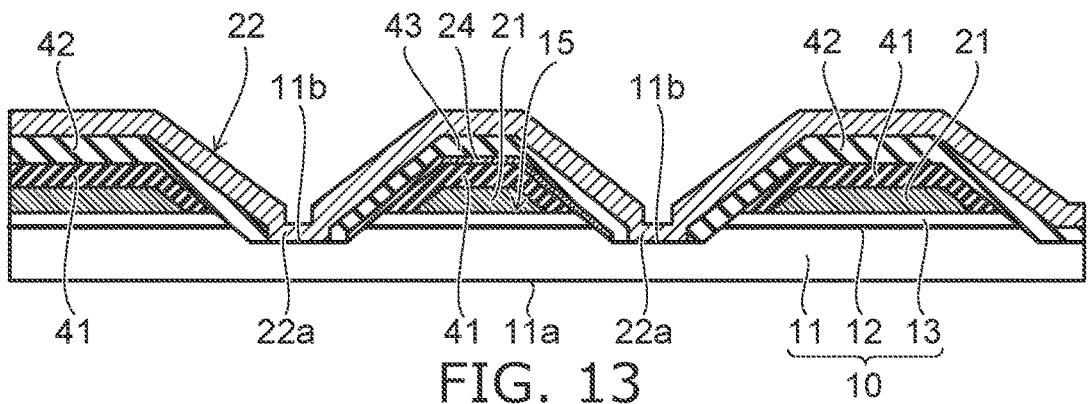

As shown in FIG. 13, a reflecting film 24 may be provided between the third insulating film and the mesa-shaped portion 15. It is favorable for the reflecting film 24 to include, for example, Ag, Al, or an alloy including these metals as major components. The third insulating film covers the reflecting film 24. The third insulating film prevents the migration of the metal when the reflecting film 24 includes the metal such as Ag or Al.

Figure 14:
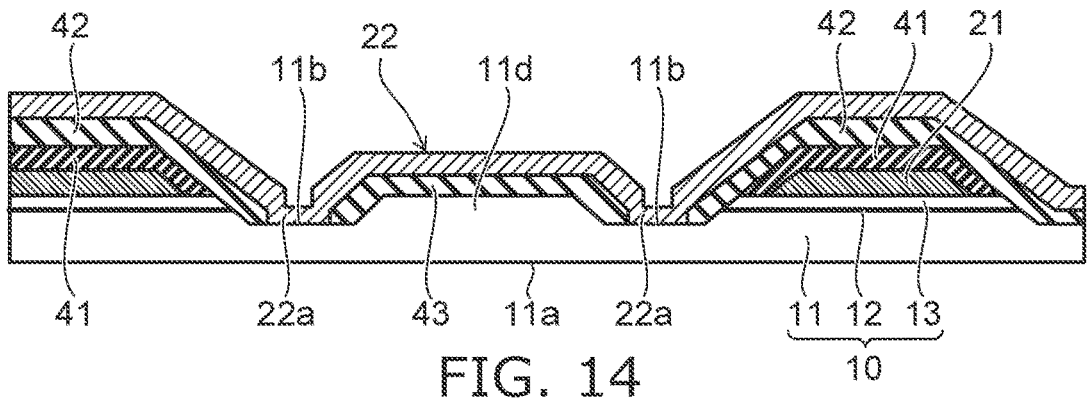

As shown in FIG. 14, a part 11d of the n-type semiconductor layer 11 may be provided on a region surrounded by the n-side contact surface 11b. The part 11d of the n-type semiconductor layer 11 does not include the light-emitting layer 12 and the p-type semiconductor layer 13. The part 11d of the n-type semiconductor layer 11 protrudes from the n-side contact surface 11b. The third insulating film is provided directly on a top surface and a side surface of the part 11d of the n-type semiconductor layer 11. The step between the n-side contact surface 11b and the top surface of the part 11d of the n-type semiconductor layer 11 can be smaller than the step between the n-side contact surface 11b and the top surface of the above mesa-shaped portion 15. The third insulating film can be easily formed with superior coverage compare to the large step. The reflecting film 24 shown in FIG. 13 may be provided between the top and side surfaces of the part 11d of the n-type semiconductor layer 11 and the third insulating film.

Certain examples of the present invention have been described above. However, the present invention is not limited to these examples. Based on the above-described embodiments of the present invention, all embodiments within the spirit of the present invention that may be implemented by one skilled in the art are also within the scope of the present invention. Additionally, one skilled in the art may conceive of various modifications that also fall within the scope of the present invention.

What is claimed is:

1. A light-emitting device comprising:
a semiconductor stacked body comprising:
an n-type semiconductor layer having an n-side contact surface,
a light-emitting layer located on a region of the n-type semiconductor layer other than the n-side contact surface, and
a p-type semiconductor layer located on the light-emitting layer,
wherein a stacked portion of the semiconductor stacked body that includes a portion of the n-type semiconductor layer, a portion of the light-emitting layer, and a portion of the p-type semiconductor layer is, in a top view, surrounded by the n-side contact surface;
a reflecting film covering the stacked portion and contacting a lateral surface of the stacked portion;
a first insulating film contacting the reflecting film;
an n-side electrode contacting the first insulating film and including an n-contact portion contacting the n-side contact surface; and
a p-side electrode located on the p-type semiconductor layer and contacting the p-type semiconductor layer.

2. The light-emitting device according to claim 1, wherein:
the n-side contact surface has a circular ring configuration in the top view, and the first insulating film has a circular configuration.

3. The light-emitting device according to claim 2, further comprising:
a second insulating film located on the p-side electrode,
wherein the n-side electrode comprises an external connection portion located on the second insulating film and connected to the n-contact portion.

4. The light-emitting device according to claim 3, wherein the second insulating film is also located at a side surface of the p-type semiconductor layer, a side surface of the light-emitting layer, a side surface of the n-type semiconductor layer, and an outer perimeter region of the n-side contact surface.

5. The light-emitting device according to claim 3, wherein the first insulating film and the second insulating film are films of the same type of material.

6. The light-emitting device according to claim 3, further comprising:
a metal member located on an upper surface of the stacked portion,
wherein the second insulating film covers the metal member, and
wherein the reflecting film covers the lateral surface of the stacked portion and an upper surface of the second insulating film.

7. The light-emitting device according to claim 1, wherein:
the portion of the n-type semiconductor layer in the stacked portion protrudes from the n-side contact surface.

8. The light-emitting device according to claim 1, further comprising:
a second insulating film located on the p-side electrode,
wherein the n-side electrode comprises an external connection portion located on the second insulating film and connected to the n-contact portion.

9. The light-emitting device according to claim 8, wherein the second insulating film is also located at a side surface of the p-type semiconductor layer, a side surface of the light-emitting layer, a side surface of the n-type semiconductor layer, and an outer perimeter region of the n-side contact surface.

10. The light-emitting device according to claim 9, wherein the first insulating film and the second insulating film are films of the same type of material.

11. The light-emitting device according to claim 8, wherein the first insulating film and the second insulating film are films of the same type of material.

12. The light-emitting device according to claim 8, further comprising:
- a metal member located on an upper surface of the stacked portion,
- wherein the second insulating film covers the metal member, and
- wherein the reflecting film covers the lateral surface of the stacked portion and an upper surface of the second insulating film.

\* \* \* \* \*